United States Patent [19]

Martinelli

[11] 4,225,874
[45] Sep. 30, 1980

[54] SEMICONDUCTOR DEVICE HAVING INTEGRATED DIODE

[75] Inventor: Ramon U. Martinelli, Hightstown, N.J.

[73] Assignee: RCA Corporation, New York, N.Y.

[21] Appl. No.: 884,857

[22] Filed: Mar. 9, 1978

[51] Int. Cl.³ .................. H01L 29/90; H01L 29/06; H01L 29/72; H01L 29/74

[52] U.S. Cl. ........................... 357/13; 357/20; 357/34; 357/38; 357/86

[58] Field of Search ................ 357/13, 20, 34, 38, 357/86

[56] References Cited

U.S. PATENT DOCUMENTS

| | | | |
|---|---|---|---|
| 3,226,612 | 12/1965 | Haenichen | 357/13 |
| 3,239,728 | 3/1966 | Aldrich et al. | 357/20 |
| 3,309,246 | 3/1967 | Haenichen | 357/13 |
| 3,341,380 | 9/1967 | Mets et al. | 357/13 |
| 3,473,975 | 10/1969 | Cullis | 357/34 |
| 3,510,735 | 5/1970 | Potter | 357/86 |
| 3,584,270 | 6/1971 | Philips | 357/86 |
| 3,739,236 | 6/1973 | Loro | 357/20 |
| 3,756,873 | 9/1973 | Kaieser | 357/20 |
| 3,836,995 | 9/1974 | Wheatley et al. | 357/46 |
| 3,852,127 | 12/1974 | Lamming | 357/20 |
| 3,936,863 | 2/1976 | Olmstead | 357/13 |
| 4,006,046 | 2/1977 | Pravin | 357/34 |
| 4,017,882 | 4/1977 | Kannam et al. | 357/13 |
| 4,153,904 | 5/1979 | Tasch et al. | 357/13 |

*Primary Examiner*—Gene M. Munson
*Attorney, Agent, or Firm*—Birgit E. Morris; Donald S. Cohen; Robert Ochis

[57] ABSTRACT

A semiconductor transistor device comprises a base region having a relatively thin portion with a thicker portion peripherally surrounding the relatively thin portion. A PN junction is between the base region and a collector region and includes at least one radius of curvature having the lowest breakdown voltage of the PN junction. An emitter region is in the thicker portion of the base region and an emitter electrode overlies the relatively thin portion.

6 Claims, 1 Drawing Figure

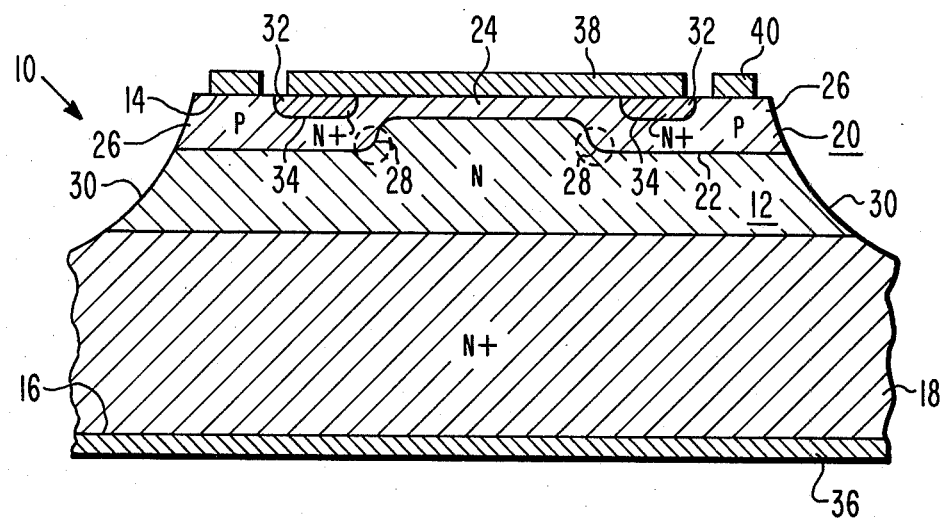

SEMICONDUCTOR DEVICE HAVING INTEGRATED DIODE

This invention generally relates to semiconductor devices and, in particular, relates to such devices which comprise integrated diode protection.

Many semiconductor devices, for example transistors, have a diode integrated therein to prevent damage to the device from extreme biasing conditions. In the case of a transistor such conditions usually exist when either the base-collector PN junction is reverse biased or when the base is "electrically open", i.e., when there is no substantial voltage applied to the base electrode. Under such conditions, the transistor can be severely damaged when the high voltage base-collector PN junction catastrophically breaks down. This breakdown usually occurs when current is forced in a reverse direction across the base-collector PN junction in the form of a high density plasma having high temperatures associated therewith. Additionally, if catastrophic failure does not result, the current flowing across the base-collector PN junction is often amplified through transistor action throughout the device. This transistor action can damage not only the device but also the load to which it is connected. For these reasons many transistors have a diode connected between the emitter and collector electrodes to protect the load and the device from any excessive voltage and current. Most of these diodes are designed to ensure that the base-collector PN junction does not break down by providing an alternate path for any current being forced through the device under the adverse biasing conditions.

One major consideration in forming such a diode is to ensure that the breakdown voltage of the protective diode is less than that of the base-collector PN junction so that the protective diode conducts before the base-collector PN junction is damaged.

Another consideration in the design of a protective diode is that the breakdown voltage thereof must usually be less than the surface breakdown voltage of the PN junction being protected since this is often the weakest point of any PN junction.

The present invention provides a novel structure having a PN junction diode which breaks down prior to any other point of the particular PN junction involved. In addition, the diode of the novel structure also breaks down prior to any surface breakdown associated with the PN junction being protected.

The single FIGURE of the drawing is a pictorial view, partially in cross-section, of a device, not drawn to scale, embodying the principles of the present invention.

A device, indicated generally at 10 in the drawing, embodying the principles of the present invention, comprises a body 12 of semiconductor material having first and second major opposing surfaces 14 and 16, respectively. The body 12 is usually silicon having a one type conductivity, for example, an average N type impurity concentration on the order of about $10^{14}$ carriers/cm$^3$. Although the material of the body 12 has been designated herein as having an N type conductivity, the principles of this invention are equally applicable to a device initially having a body of P type material providing all other conductivities designated herein are likewise changed. In the preferred embodiment the body 12 has a thickness on the order of about 200 micrometers.

A first region 18 having the one type conductivity is formed within the body 12 adjacent the second surface 16. For reasons known in the art, the first region 18, which can serve as a collector contact region in a transistor structure, has a comparatively higher impurity concentration than the impurity concentration of the remainder of the body 12. For example, it can have a surface impurity concentration on the order of about $5 \times 10^{20}$ carriers/cm$^3$. Preferably, the first region 18 extends into the body 12 about 60 micrometers from the second surface 16. The first region 18 can be formed by methods known in the art such as diffusion, epitaxially growing a layer of silicon, or the like.

A second region 20 having a second type conductivity, in this instance P type, is adjacent the first surface 14 and extends into the body 12 forming a first PN junction 22 at the interface therewith. The second region 20 comprises a relatively thin portion 24 and a thicker portion 26, the thicker portion 26 peripherally encloses the relatively thin portion 24. Specifically, it is preferred that the thicker portion 26 extend into the body 12 to a depth of about 60 micrometers from the first surface 14 while the thin portion 24 only extends to a depth therefrom of about 30 micrometers. In the preferred embodiment the second region 20 is spaced apart from the first region 18 by the material of the body 12. Preferably the second region 20 has a surface impurity concentration on the order of about $10^{17}$ carriers/cm$^3$. In a specific embodiment the thicker portion 26 peripherally surrounds the relatively thin portion 24 which has a width on the order of about 500 micrometers. Operationally, when the device 10 is a transistor the second region 20 functions as the base region thereof.

The first PN junction 22 formed between the second region 20 and the body 12 of semiconductor material adjacent thereto has at least one radius of curvature indicated by the broken circle at 28 associated with the transition between the thicker portion 26 and the relatively thin portion 24. The radius of curvature 28 has a breakdown voltage associated therewith and, as more fully discussed below, this breakdown voltage is the lowest value of the positionally dependent breakdown voltage associated with the first PN junction 22. For the specific values stated above, the first PN junction 22 has a surface breakdown voltage on the order of about 1500 volts, while the breakdown voltage at the radius of curvature 28 is on the order of about 1400 volts. While the first PN junction 22 is depicted in the drawing as terminating at a mesa sidewall 30 it is within the principles of this invention to fabricate the device 10 so that the first PN junction 22 terminates at the first surface 14.

A third region 32 having one type conductivity is adjacent the first surface 14 and extends into the thicker portion 26 of the second region 20, for example to a depth of about 20 micrometers from the first surface 14. Preferably, the third region 32 is annular and peripherally surrounds the relatively thinner portion 24 of the second region 20. Although this third region 32 may be a ring, the use of the word annular herein includes any geometric shape. In this example the third region 32 has a surface impurity concentration on the order of about $5 \times 10^{20}$ carriers/cm$^3$. The third region 32 forms a second PN junction 34 with the second region 20 at the interface therewith. If the device 10 is a transistor the third region 32 functions as the emitter region thereof.

A first electrode 36 overlies the second surface 16 and electrically contacts the first region 18 adjacent thereto.

A second electrode 38 overlies the first surface 14 and electrically contacts the third region 32 and the relatively thin portion 24 of the second region 20. In this example, wherein the third region 32 is in the shape of a ring or doughnut the second electrode 38 is a solid layer of metallization completely overlying the relatively thin portion 24 of the second region 20 enclosed thereby. A third electrode 40 overlies and electrically contacts portions of the thicker portion 26 of the second region 20 and, in this example, extends around the periphery of the second electrode 38 and is spaced apart therefrom.

While known fabrication techniques can be utilized to form the various regions discussed above, certain precautions must be taken to insure that the radius of curvature 28 associated with the first PN junction 22 along the transition between the thicker portion 26 and the relatively thin portion 24 be the point of lowest breakdown voltage. This is relatively easily accomplished if the first PN junction 22 terminates at the mesa surface 30 since known passivation techniques can be utilized to insure that the radius of curvature 28 breaks down first. This can be accomplished using known passivation and glassing techniques. If, however, the first PN junction 22 terminates at, for example the first surface 14, then it is possible that a second radius of curvature is involved, now shown in the drawings. The second radius of curvature would be part of the transition of the first PN junction 22 between the thicker portion 26 and the first surface 14. Under these circumstances, known techniques can be used to vary the dopant profile and concentration to insure that the radius of curvature 28 associated with the transition between the thicker portion 26 and the relatively thin portion 24 has a smaller radius than any other radius of curvature along the first PN junction 22. As well known in the art, the smaller radius of curvature 28 will break down before the segment of the PN junction 22 having the larger radius of curvature. Referring to the mesa structure shown in the drawing, the radius of curvature 28 associated with the first PN junction 22 can be considered as having an interior radius of curvature, the term interior, in this instance, is used to indicate a radius of curvature which can be considered concave which faces the center of the second electrode 38.

Operationally for the values given above the second PN junction 34 has a reverse bias breakdown voltage on the order of about 10 volts while the first PN junction 22 has a breakdown voltage, at the radius of curvature 28, on the order of about 1400 volts. When the operating conditions are such that the first PN junction 22 is excessively reverse biased the radius of curvature 28 breaks down in an avalanche mode prior to the rest of the PN junction 22 and conducts current between the second and first electrodes, 38 and 36, respectively. In fact, since the radius of curvature 28 breaks down substantially completely along its entire extent, the current which is conducted is spread over a relatively large area and therefore has a relatively low density compared to conventional PN junctions which tend to break down at single points. Such a current spreading PN junction 22, effectively operating as a large current handling diode, protects the device 10 from damage due to high current density plasmas. Thus, a device 10 having a structure according to the principles of the present invention is capable of sustaining large amounts of reverse base-collector current.

What is claimed is:

1. A semiconductor device comprising:
    a body of semiconductor material having first and second major opposing surfaces;
    a first region within said body having one type conductivity, said first region being adjacent said second surface;
    a second region within said body adjacent said first surface having a second type conductivity and forming a first PN junction with said first region at the interface therebetween, said first PN junction having a positionally dependent breakdown voltage associated therewith and having a point of lowest value of breakdown voltage therealong;
    said second region comprising a relatively thicker portion and a relatively thinner portion, said relatively thicker portion substantially completely peripherally surrounding said relatively thinner portion;
    said second region having a surface impurity concentration on the order of about $10^{17}$ carriers/cm$^3$, said relatively thicker portion extends to a depth of about 60 micrometers from said first surface; and
    said relatively thinner portion extending to a depth of about 30 micrometers from said first surface;
    a third region having said one type conductivity adjacent said first surface and extending into said second region, said third region forming a second PN junction with said second region at the interface therewith;
    said third region extending into said relatively thicker portion of said second region and substantially completely peripherally surrounding said relatively thinner portion; and
    a first electrode overlying and electrically contacting said third region and the portion of said second region overlying said point of lowest value.

2. A semiconductor device as claimed in claim 1 further comprising:
    a second electrode overlying and electrically contacting said relatively thicker portion of said second region, said second electrode substantially completely peripherally enclosing said first electrode.

3. A semiconductor device as claimed in claim 1 wherein:
    said first PN-junction has a radius of curvature along said first PN-junction between said relatively thicker portion and said relatively thinner portion, said radius of curvature having a breakdown voltage associated therewith; said breakdown voltage associated with said radius of curvature having the lowest value of said positionally dependent breakdown voltage.

4. A semiconductor device as claimed in claim 1 wherein:
    said body having average impurity concentration on the order of about $10^{14}$ carriers/cm$^3$, is on the order of about 200 micrometers thick; and
    said first region having a high conductivity portion which has a surface impurity concentration on the order of about $5 \times 10^{20}$ carriers/cm$^3$ and extends into said body to a depth of about 60 micrometers from said second surface.

5. A semiconductor device as claimed in claim 4 wherein:
    said third region has a surface impurity concentration on the order of about $5 \times 10^{20}$ carriers/cm$^3$ and extends into said relatively thicker portion to a depth of about 20 micrometers from said first surface.

6. A semiconductor device as recited in claim 1 wherein:
said device is a transistor;
said first region is the collector of the transistor;
said second region is the base of the transistor;
said third region is the emitter of the transistor whereby said region of lowest value of breakdown voltage constitutes a diode connected between the collector and emitter of the transistor.

* * * * *